(12) United States Patent
Yu

(10) Patent No.: US 6,312,995 B1
(45) Date of Patent: Nov. 6, 2001

(54) MOS TRANSISTOR WITH ASSISTED-GATES AND ULTRA-SHALLOW "PSUEDO" SOURCE AND DRAIN EXTENSIONS FOR ULTRA-LARGE-SCALE INTEGRATION

(75) Inventor: Bin Yu, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/263,557

(22) Filed: Mar. 8, 1999

(51) Int. Cl.[7] .................................................. H01L 21/336
(52) U.S. Cl. ........................ 438/283; 438/596; 438/595; 438/267
(58) Field of Search ..................................... 438/304, 267, 438/596, 595, 283; 257/65

(56) References Cited

U.S. PATENT DOCUMENTS 5,358,879 * 10/1994 Brady et al. ........................ 438/163
5,741,736 * 4/1998 Orlowski et al. ................... 438/286

OTHER PUBLICATIONS

King, et al., "Polycrystalline Silicon–Germanium Thin–Film Transistors", IEEE Transactions on Electron Devices, vol. 41, No. 9 pp. 1581–1591, Sep. 1994.*

* cited by examiner

*Primary Examiner*—Carl Whitehead, Jr.
*Assistant Examiner*—Christy Novacek
(74) *Attorney, Agent, or Firm*—Davis Chin

(57) ABSTRACT

A MOS transistor and a method of fabricating the same for Ultra Large Scale Integration applications includes a composite gate structure. The composite gate structure is comprised of a main gate electrode and two assisted-gate electrodes disposed adjacent to and on opposite sides of the main gate electrode via an oxide layer. Areas underneath the two assisted-gate electrodes form ultra-shallow "pseudo" source/drain extensions. As a result, these extensions have a more shallow depth so as to enhance immunity to short channel effects.

10 Claims, 2 Drawing Sheets

MOS TRANSISTOR WITH ASSISTED-GATES AND ULTRA-SHALLOW "PSUEDO" SOURCE AND DRAIN EXTENSIONS FOR ULTRA-LARGE-SCALE INTEGRATION

BACKGROUND OF THE INVENTION

This invention relates generally to ultra-large-scale integration (ULSI) MOSFET integrated circuits. More particularly, it relates to a new and novel MOS transistor and a method of fabricating the same for ULSI systems which includes two assisted-gate electrodes to form ultra-shallow "pseudo" source/drain extensions.

As is generally known, in recent years advances made in the semiconductor process methodologies have dramatically decreased the device dimension sizes and have increased the circuit density on the IC chips. A MOSFET (metal-oxide-semiconductor field-effect transistor) device such as an N-channel MOS transistor or a P-channel MOS transistor has been used extensively for ultra-large-scale integration applications. Typically, the MOSFET devices are fabricated by patterning polysilicon gate electrodes over a thin gate oxide on a single crystal semiconductor substrate. The gate electrode is used as a diffusion or implant barrier mask to form self-aligned source/drain regions in the substrate adjacent to and on opposite sides of the gate electrode. The distance from the source region to the drain region under the gate electrode is defined as the "channel length" of the MOSFET device. Currently, the channel length dimension is less than 0.5 microns.

In order to increase the speed of the MOSFET devices, there has existed in the micro-electronics industry over the past two decades an aggressive scaling-down of the channel length dimensions. However, as the channel length reduction of the MOS transistor occurs, the source/drain extension junction depth must also be likewise aggressively reduced down in order to achieve acceptable immunity to the problem of "short-channel effects." One method of solving this short-channel effect problem is to form ultra-shallow extensions. Unfortunately, this method suffers from the drawback that it is very difficult to form such ultra-shallow extensions by using the conventional ion implantation technique. As a result, the problem of forming ultra-shallow extensions has become one of the major concerns for advanced deep-submicron MOSFET technology which limits its performance.

In view of the foregoing, there exists a need for MOS transistor and a method of fabricating the same for use in ULSI applications so as to provide ultra-shallow extensions without using the ion implantation process.

SUMMARY OF THE INVENTION

Accordingly, it is a general object of the present invention to provide a novel method for fabricating a MOS transistor for use in ultra-large-scale integration applications.

It is an object of the present invention to provide an improved MOS transistor structure and a method of fabricating the same for use in ULSI applications.

It is another object of the present invention to provide an improved MOS transistor and a method of fabricating the same for ULSI applications which includes two assisted-gate electrodes to form ultra-shallow "pseudo" source/drain extensions.

It is still another object of the present invention to provide an improved MOS transistor structure which is comprised of a composite gate structure formed of a main gate region and a pair of assisted-gate regions disposed adjacent to and on opposite sides of the main gate region via an oxide layer.

In accordance with a preferred embodiment of the present invention, there is provided a MOS transistor with assisted-gate electrodes for ultra-large-scale integration. A thin gate dielectric layer is formed on a surface of a semiconductor substrate. A composite gate structure is formed over the thin gate dielectric layer. The composite gate structure consists of a main gate region and a pair of assisted-gate regions disposed adjacent to and on opposite sides of the main gate region via an oxide layer. Source/drain regions are formed on the semiconductor substrate on opposite sides of the pair of assisted-gate regions. Sidewall spacers are formed on each side of the pair of assisted-gate regions. Silicide contacts are formed over the source/drain regions and the composite gate structure.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

The process steps and structures described below do not form a complete process flow for manufacturing MOSFET integrated circuits. The present invention can be practiced in conjunction with MOSFET integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn in order to best illustrate the salient features of the present invention.

Figure 1:
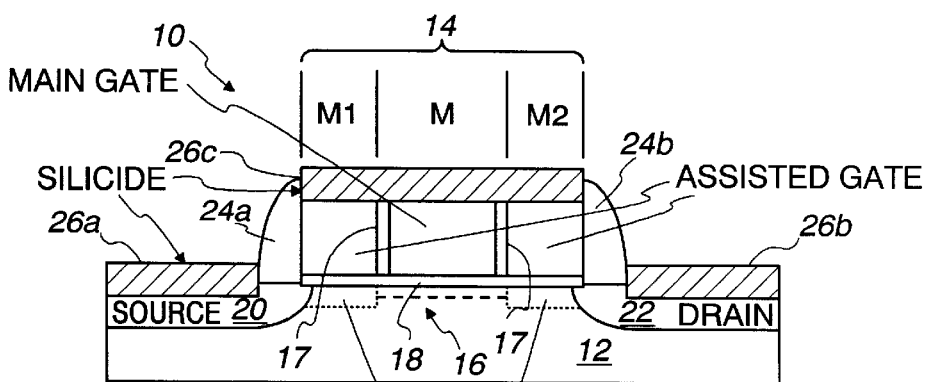
FIG. 1 is a cross-sectional view of a MOS transistor structure, constructed in accordance with the principles of the present invention.

Referring now in detail to the drawings, there is illustrated in FIG. 1 a cross-sectional view of a MOSFET (metal-oxide-semiconductor field-effect transistor) or MOS transistor structure 10 constructed in accordance with the principles of the present invention. As fabricated, the MOS transistor structure 10 is formed over a semiconductor substrate 12 or a doped well region formed within a semiconductor substrate. If an N-channel MOS (NMOS) transistor is to be built, then a p-well region or a p-type substrate would be used. On the other hand, for a P-channel MOS (PMOS) transistor an n-well region or an n-type substrate would be used. A composite gate structure 14 is formed over a channel region 16 and is separated from the semiconductor substrate 12 by a thin gate dielectric layer 18. A source region 20 and a drain region 22 are formed in the substrate 12 with the channel region 16 being sandwiched therebetween. Sidewall spacers 24a, 24b serving as insulating film are formed adjacent to each side of the composite gate structure 14.

Silicide layers 26a, 26b and 26c are formed over the respective source region 20, drain region 22 and composite gate structure 14. The composite gate structure 14 is comprised of a main gate region M and a pair of assisted-gate regions M1, M2 disposed adjacent to and on each side of the main gate region M via an oxide layer 17.

The two assisted-gate regions M1, M2 have a smaller work function than that of the main gate region M for the case of the NMOS transistor or have a larger work function than that of the main gate region for the case of the PMOS transistor. Therefore, the parasitic transistors formed underneath the respective assisted gate regions M1 and M2 will always have threshold voltages of smaller absolute values than the threshold voltage of the main transistor formed under the main gate region M. As a consequence, the parasitic transistors in the assisted gate regions M1 and M2 will always be rendered conductive or in a turned ON-state before the main transistor in the main gate region M is rendered conductive or turned ON. These parasitic transistors have been purposely designed so as to be operated in a depletion mode, i.e., the channel area underneath the assisted gate regions M1, N2 are deeply inverted even when no bias voltage (zero volts) is being applied to the gate structure 14.

In the case of the NMOS transistor, the main gate region M is formed of a $p^+$ polycrystalline silicon (polysilicon or poly-Si) material and the two assisted gate regions M1, M2 are formed of a $p^+$ poly-$Si_{1-x}Ge_x$ material, where x is the composition of germanium. On the other hand, in the case of the PMOS transistor, the main gate region N is formed of $p^+$ poly-$Si_{1-x}Ge_x$ material and the two assisted-gate regions M1 M2 are formed of a $p^+$ poly-Si material. The work function of the $p^+$ poly-$Si_{1-x}Ge_x$ material is dependent upon the composition x of the germanium material being used. It is believed by the inventors that the work function of the $p^+$ poly-$Si_{1-x}Ge_x$ material will be reduced approximately 40 mV for each ten percent (10%) increase in the Ge composition.

In operation, when the gate bias voltage is raised to the threshold voltage of the main transistor, the silicon surface of the main transistor starts to be inverted and the majority carriers will flow into the channel region 16 between the source and drain regions 20, 22. As a result, the overall MOS transistor device 10 will then be conductive or turned ON. This is due to the fact that the silicon surface in the assisted-gate regions M1, M2 are already deeply inverted and thus will act as ultra-shallow "pseudo" source/drain extensions 20a, 22a of the respective source and drain regions 20, 22. These "pseudo" source/drain extensions have a much shallower junction depth as compared to lightly-doped source/drain (LDD) extensions formed by the conventional ion implantation technique. Thus, the MOS transistor structure 10 will have a superior immunity to "short-channel effects" and have a better overall performance. The fabrication steps of the present invention for manufacturing an NMOS transistor will now be described in detail with reference to FIGS. 2(a) through 2(e).

Figure 2A:
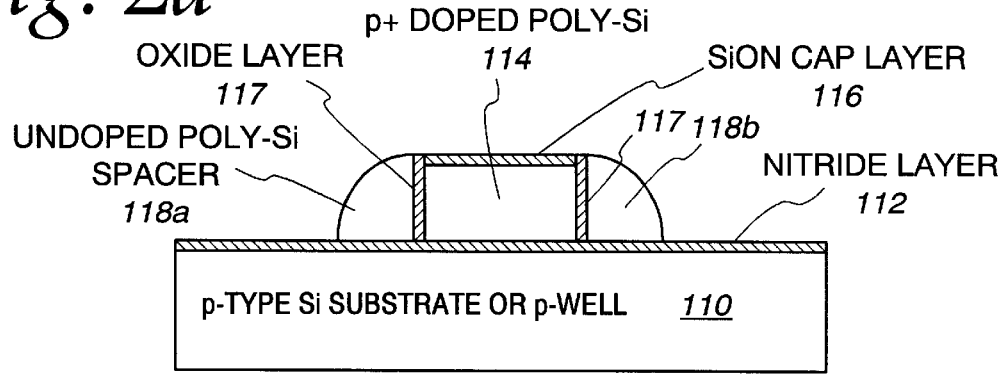
FIGS. 2(a) through 2(e) are cross-sectional views of the fabrication steps for forming an N-channel MOS transistor structure, according to the method of the present invention.

First, in FIG. 2(a) there is provided a p-type semiconductor (silicon) substrate or p-well region 110 on top of which is formed a gate dielectric layer 112, which is preferably a thermally grown thin silicon nitride having a thickness on the order of 20–40 Å. Then, an undoped polysilicon (poly-Si) gate layer having a thickness between 1000–2500 Å is formed over the surface of the gate dielectric layer 112. A $p^+$ in-situ doping process of the poly-Si gate layer is performed as the gate layer is being formed. Next, the poly-Si gate layer and the gate dielectric layer 112 are patterned using conventional photolithographic techniques followed by anisotropical dry etching so as to form a main gate electrode 114, as depicted in FIG. 2(a).

Then, a thin cap layer 116 of SiON (silicon oxynitride) is formed on the top surface of the main gate electrode 114 so as to protect the same during a subsequent step of source/drain implantation. The thickness of the SiON layer 116 is on the order of 300–400 Å in thickness. An oxide layer 117 is grown by thermal oxidation in a well-known dry oxygen process at 800–1000° C. The oxide layer 117 serves as a barrier layer. Next, first sidewall spacers 118a, 118b are formed adjacent to each side of the main gate electrode 114 via the oxide layer 117. The formation of the first sidewall spacers 118a, 118b is preferably achieved by depositing an undoped polysilicon layer using a low-pressure chemical-vapor deposition (LPCVD) process followed by anisotropical dry etching. The width of the first side-wall spacers 118a, 118b is approximately 400–800 Å in thickness.

Figure 2B:
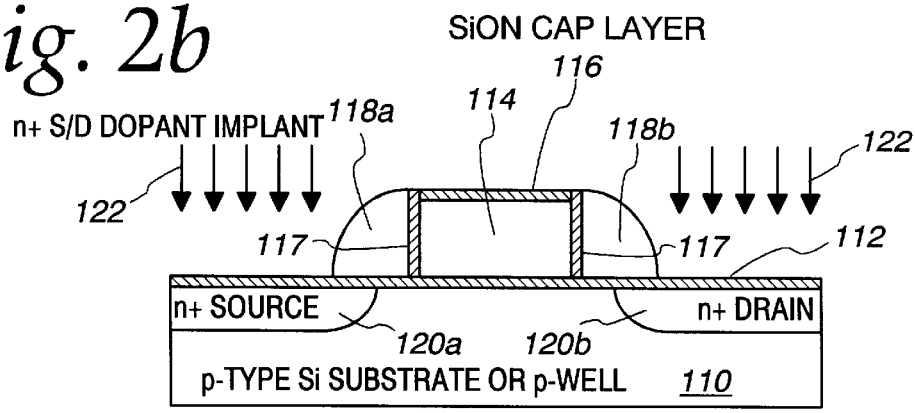
Figure 2C:
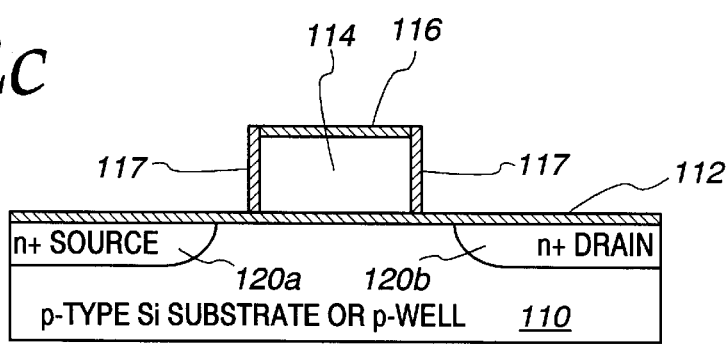

After formation of the spacers 118a and 118b, $n^+$ highly-doped source/drain regions 120a and 120b are implanted into the silicon substrate 110 at self-aligned positions with the first sidewall spacers. This is illustrated in FIG. 2(b). It should be noted that the n-type dopant used is preferably arsenic (As) or phosphorus (P) ions as indicated by arrows 122. The dosage is typically on the order of $1 \times 10^{15}$ ions/cm$^2$ to $5 \times 10^{15}$ ions/cm$^2$, and the energy level for implantation is between 10–30 KeV. Following the source/drain implants, the first sidewall spacers 118a, 118b are removed preferably by a wet chemical etching process. This is shown in FIG. 2(c). Thereafter, a furnace annealing or high temperature rapid thermal annealing (RTA) at temperatures between 1000–1100° C. is performed (not shown) on the silicon substrate in order to activate the dopants in the implanted source and drain regions 120a, 120b.

Next, two assisted-gate electrodes 124a, 124b are formed adjacent to and on each side of the main gate electrode 114 via the oxide layer 117. Thus, the main gate electrode 114, the oxide layer 117 and the two assisted-gate electrodes 124a, 124b define a composite gate structure. The two assisted-gate electrodes 124a, 124b are formed by depositing an undoped gate insulating layer on the order of 2000–3000 Å over the source region 120a, main gate electrode 114 and drain region 120b. Preferably, the deposited gate insulating layer is an undoped poly-$Si_{1-x}Ge_x$ material which is deposited by an LPCVD process. Then, a $p^+$ in-situ doping process on the gate insulating layer is performed as the assisted-gate electrodes are being formed. Thereafter, an anisotropical dry etching is performed to etch-away the gate insulating layer so as to form the two assisted-gate electrodes 124a, 124b. The width of the two assisted-gate electrodes 124a, 124b is approximately 300–600 Å in thickness.

Figure 2D:
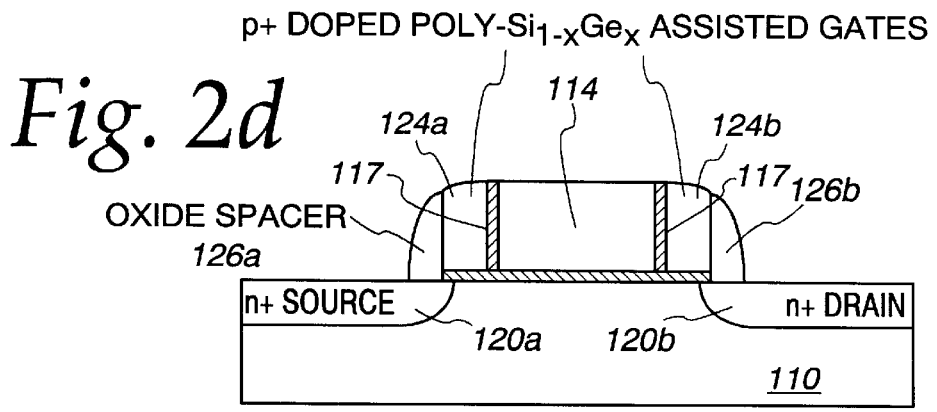

The composition of the germanium (Ge) is preferably between 50–75% in order to yield a difference of work function (and hence the threshold voltage of the transistor) between the main gate transistor and the two assisted-gate transistors. The threshold voltage difference is approximately between 0.2 to 0.3 volts. Then, an anisotropical dry etch is performed so as to remove the uncovered portion of the nitride layer 112 on the top surface of the silicon substrate and the SiON cap layer 116 from the top surface of the main gate electrode 114. Thereafter, second sidewall spacers 126a, 126b are formed (by deposition and then etch-back) adjacent to and on both sides of the two assisted-gate electrodes 124a, 124b. The width of the second sidewall spacers 126a, 125b is approximately 300–500 Å in thickness. This is illustrated in FIG. 2(d) of the drawings.

Figure 2E:
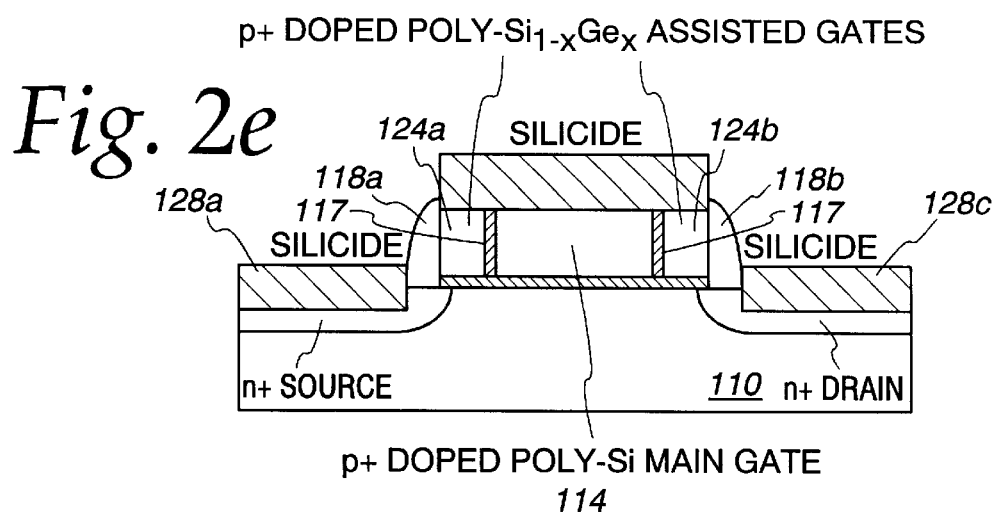

After formation of the second sidewall spacers 126a and 126b, refractory metal silicide contacts or regions 128a, 128b and 128c are formed over the respective drain region 120a, composite gate structure and source region 120b. Typically, the refractory metal silicide contacts 128a–128c are on the order of 200 to 500 Å in thickness. The silicide contacts result from the thermal reaction of a refractory metal such as titanium (Ti), cobalt (Co), nickel (Ni) and the like with silicon so as to form the silicide layer (TiSi$_2$, CoSi$_{21}$ or NiSi$_2$). Further, these silicide contacts are formed by a process known as self-aligned silicide (SALICIDE) process based on annealing in a nitrogen, ammonia, or an inert ambient environment. This is shown in FIG. 2(e). The subsequent remaining process flow steps of the standard MOSFET fabrication, such as passivation and metallization for forming contacts, interconnects and the like are quite conventional and thus will not be described.

Figure 3:
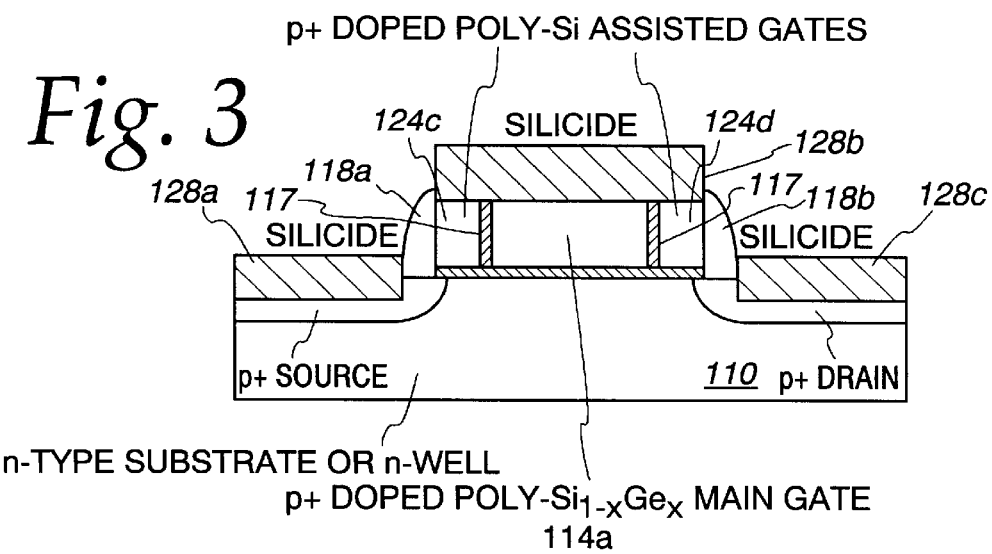
FIG. 3 is a cross-sectional view of a P-channel MOS transistor structure in accordance with the principles of the present invention.

It should be clearly understood that the description given above in connection with FIGS. 2(a) through 2(e) are for constructing a new NMOS transistor structure. However, the present invention can be applied equally to an n-type substrate or n-well so as to build a new PMOS transistor structure since the interchangeability of p-type and n-type semiconductor elements is well known to those of ordinary skill in the art. Further, the dopant type or polarity used in the case of the PMOS transistor would be the opposite. Also, the primary difference for the PMOS transistor structure is that the main gate electrode 114a is formed of a p$^+$ in-situ doped polySi$_{1-x}$Ge$_x$ material and that the two assisted-gate electrodes 124c, 124d are formed of a p$^+$ in-situ doped poly-Si material. Such a PMOS transistor constructed in accordance with the principles of the present invention is illustrated in FIG. 3.

From the foregoing detailed description, it can thus be seen that the present invention provides a new and novel MOS transistor structure and a method of fabricating the same for ultra-large-scale integration applications. The MOS transistor of the present invention includes a composite gate structure formed of a main gate electrode and two assisted-gate electrodes disposed adjacent to and on opposite sides of the main gate electrode via an oxide layer. The areas underlying the assisted-gate electrodes form ultra-shallow "pseudo" source/drain extensions of source and drain regions, thereby enhancing immunity to short-channel effects.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method for fabricating a MOS transistor with assisted-gate electrodes for ULSI, said method comprising the steps of:

forming a thin gate dielectric layer on a top surface of a semiconductor substrate;

forming a first doped polysilicon or polysilicon-germanium layer on a surface of said gate dielectric layer;

patterning said first doped polysilicon or polysilicon-germanium layer and said gate dielectric layer to form a main gate electrode;

forming a thin cap layer on a top surface of said main gate electrode;

forming an oxide layer on opposite sides of said main-gate electrode;

forming first sidewall spacers on each side of said oxide layer;

forming highly-doped source/drain regions in said semiconductor substrate on opposite sides of said main gate electrode;

removing said first sidewall spacers;

annealing said semiconductor substrate so as to activate dopants in said highly-doped source/drain regions;

forming second doped polysilicon-germanium or polysilicon layer over said main gate electrode and exposed surfaces of said gate dielectric layer;

patterning said second doped polysilicon-germanium or polysilicon layer and said gate dielectric layer to form a pair of assisted-gate electrodes on opposite sides of said oxide layer and overlying portions of said gate dielectric layer which are located over corresponding areas of the top surface of the semiconductor substrate defining ultra-shallow "pseudo" source/drain regions;

forming second sidewall spacers adjacent said pair of assisted-gate electrodes;

removing uncovered portions of said gate dielectric layer on said top surface of said semiconductor substrate to expose said highly-doped source/drain regions and said thin cap layer on the top surface of said main gate electrode; and forming silicide contacts over said exposed highly-doped source/drain regions and exposed surfaces of said main and assisted-gate electrodes.

2. A method for fabricating a MOS transistor as claimed in claim 1, wherein said thin gate dielectric layer is formed of silicon nitride.

3. A method for fabricating a MOS transistor as claimed in claim 1, wherein said semiconductor substrate is p-type silicon substrate and said source/drain regions are formed of n-type dopants.

4. A method for fabricating a MOS transistor as claimed in claim 3, wherein said main gate electrode is formed of a p$^+$ doped poly-Si material and said pair of assisted-gate electrodes are formed of a p$^+$ doped poly-Si$_{1-x}$Ge$_x$ material.

5. A method for fabricating a MOS transistor as claimed in claim 4, wherein the composition x of Ge is between 50–75%.

6. A method for fabricating a MOS transistor as claimed in claim 1, wherein said semiconductor substrate is n-type silicon substrate and said source/drain regions are formed of p-type dopants.

7. A method for fabricating a MOS transistor as claimed in claim 6, wherein said main gate electrode is formed of a p$^+$ doped poly-Si$_{1-x}$Ge$_x$ material and said pair of assisted-gate electrodes are formed of a p$^+$ doped poly-Si material.

8. A method for fabricating a MOS transistor as claimed in claim 7, wherein the composition x of Ge is between 50–75%.

9. A method for fabricating a MOS transistor as claimed in claim 1, wherein said silicide contacts are formed by a refractory metal consisting of Ti, Co, or Ni.

10. A method for fabricating an N-channel MOS transistor with assisted-gate electrodes for ULSI, said method comprising the steps of:

forming a thin gate dielectric layer on a top surface of a p-type semiconductor substrate;

forming a doped poly-Si layer on a surface of said gate dielectric layer;

patterning said doped poly-Si layer and said gate dielectric layer to form a main gate electrode;

forming a thin cap layer on a top surface of said main gate electrode;

forming an oxide layer on opposite sides of said main gate electrode;

forming first sidewall spacers on each side of said oxide layer;

forming n$^+$ highly-doped source/drain regions in said semiconductor substrate on opposite sides of said main gate electrode;

removing said first sidewall spacers;

annealing said semiconductor substrate so as to activate dopants in said n$^+$ highly-doped source/drain regions;

forming doped poly-Si$_{1-x}$Ge$_x$ layer over said main gate electrode and exposed surfaces of said gate dielectric layer;

patterning said doped poly-Si$_{1-x}$Ge$_x$ layer and said gate dielectric layer to form a pair of assisted-gate electrodes on opposite sides of said oxide layer and overlying portions of said gate dielectric layer which are located over corresponding areas of the top surface of the semiconductor substrate defining ultra-shallow "pseudo" source/drain regions;

forming second sidewall spacers adjacent said pair of assisted-gate electrodes;

removing uncovered portions of said gate dielectric layer on said top surface of said semiconductor substrate to expose said n$^+$ highly-doped source/drain regions and said thin cap layer on the top surface of said main gate electrode; and forming silicide contacts over said exposed n$^+$ highly-doped source/drain regions and exposed surfaces of said main and assisted-gate electrodes.

* * * * *